United States Patent
Song et al.

(10) Patent No.: US 7,110,317 B2
(45) Date of Patent: Sep. 19, 2006

(54) SRAM EMPLOYING VIRTUAL RAIL SCHEME STABLE AGAINST VARIOUS PROCESS-VOLTAGE-TEMPERATURE VARIATIONS

(75) Inventors: Tae-joong Song, Gyeonggi-do (KR); Jae-seung Choi, Suwon-si (KR)

(73) Assignee: Samsung Electronics, Co., Ltd., (KR)

( * ) Notice: Subject to any disclaimer, the term of this patent is extended or adjusted under 35 U.S.C. 154(b) by 0 days.

(21) Appl. No.: 11/124,787

(22) Filed: May 9, 2005

(65) Prior Publication Data

US 2006/0002223 A1    Jan. 5, 2006

(30) Foreign Application Priority Data

Jul. 2, 2004    (KR)  ............ 10-2004-0051525

(51) Int. Cl.
*G11C 5/14* (2006.01)
*G11C 11/00* (2006.01)

(52) U.S. Cl. .................. 365/226; 365/154
(58) Field of Classification Search .......... 365/226, 365/154, 156, 227
See application file for complete search history.

(56) References Cited

U.S. PATENT DOCUMENTS

| | | | | |
|---|---|---|---|---|
| 4,764,897 A | * | 8/1988 | Kameyama et al. | 365/154 |
| 5,274,601 A | * | 12/1993 | Kawahara et al. | 365/230.06 |
| 5,986,923 A | | 11/1999 | Zhang et al. | 365/154 |
| 6,166,985 A | * | 12/2000 | McDaniel et al. | 365/230.06 |
| 6,549,453 B1 | | 4/2003 | Wong | 365/156 |
| 6,560,139 B1 | | 5/2003 | Ma et al. | 365/154 |
| 6,603,345 B1 | * | 8/2003 | Takahashi | 327/534 |
| 6,643,173 B1 | | 11/2003 | Takemura | 365/185.05 |

FOREIGN PATENT DOCUMENTS

| | | |
|---|---|---|
| JP | 07-296587 | 11/1995 |
| JP | 2003-22677 | 1/2003 |

\* cited by examiner

*Primary Examiner*—Anh Phung
(74) *Attorney, Agent, or Firm*—Mills & Onello LLP (57) ABSTRACT

An SRAM employs a virtual rail configuration that is stable against process-voltage-temperature (PVT) variation. The SRAM provides a virtual power supply voltage to an SRAM cell that is obtained by lowering a power supply voltage by a threshold voltage of a transistor and a virtual ground voltage obtained by raising a ground voltage by a threshold voltage of a transistor. Due to the use of PMOS and NMOS transistors of diode types connected between the power supply voltage and the virtual power supply voltage and the use of NMOS and PMOS transistors of diode types connected between the ground voltage and the virtual ground voltage, a virtual power supply voltage level and a virtual ground voltage level that are stable even against various PVT variations are provided, so that low-leakage current characteristics are stable.

14 Claims, 8 Drawing Sheets

SRAM EMPLOYING VIRTUAL RAIL SCHEME STABLE AGAINST VARIOUS PROCESS-VOLTAGE-TEMPERATURE VARIATIONS

BACKGROUND OF THE INVENTION

This application claims the benefit of Korean Patent Application No. 2004-51525, filed on Jul. 2, 2004, in the Korean Intellectual Property Office, the disclosure of which is incorporated herein in its entirety by reference.

1. Field of the Invention

The present invention relates to a semiconductor memory device, and more particularly, to a synchronous random access memory (SRAM) device employing a virtual rail scheme that is stable against various process-voltage-temperature (PVT) variations.

2. Description of the Related Art

Figure 1:
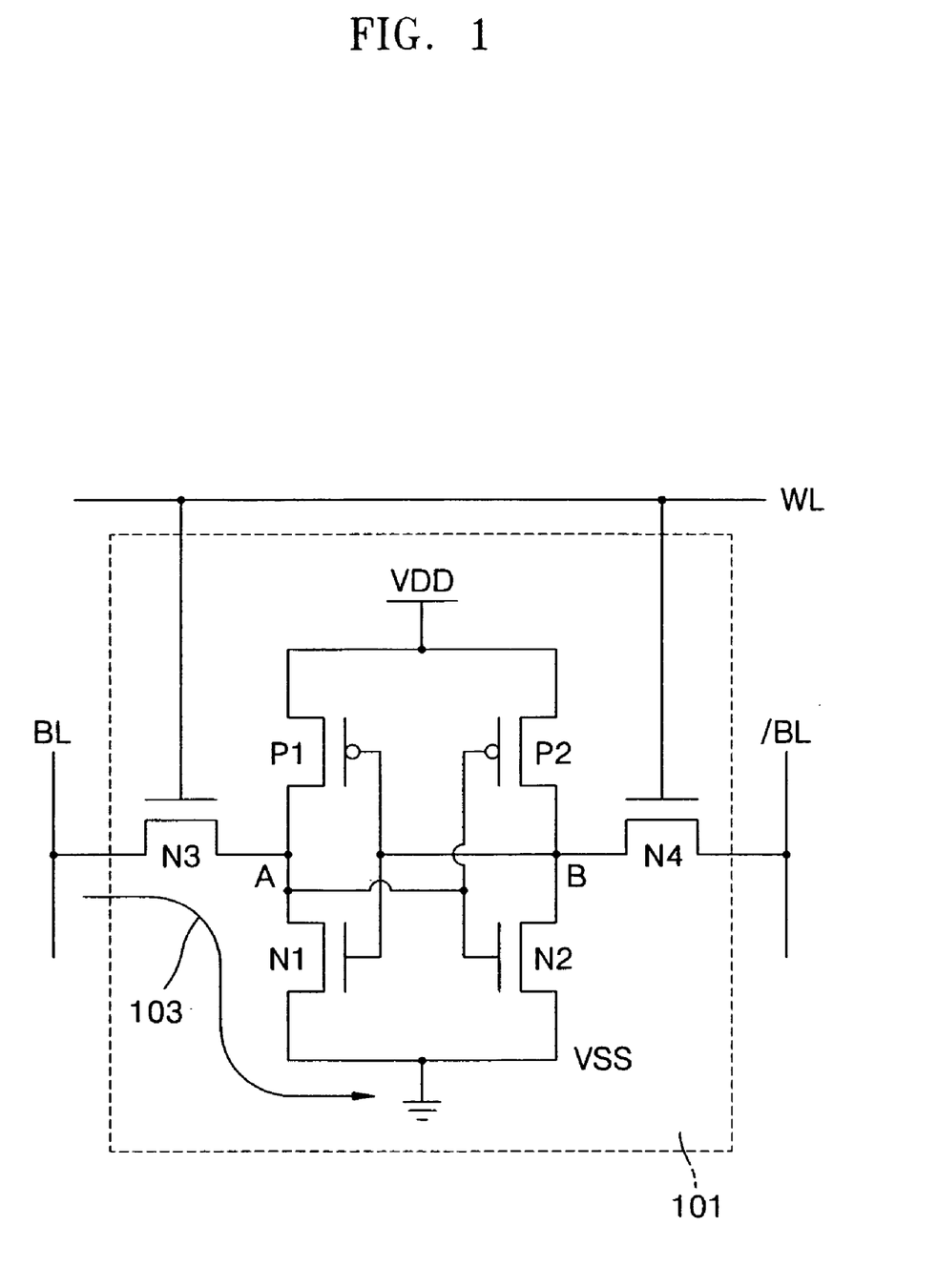
FIG. 1 is a circuit diagram of a conventional 6T SRAM cell.

FIG. 1 is a circuit diagram of an SRAM cell 101, which is generally used in an SRAM memory array and comprised of 6 transistors. The SRAM cell 101 is well known as a 6T SRAM cell. In the SRAM cell 101, NMOS transistors N1 and N2 are connected between a ground voltage VSS and a node A and between the ground voltage VSS and a node B, respectively, and the nodes A and B are connected to a power supply voltage VDD via PMOS transistors P1 and P2, respectively. The node A is connected to gates of the transistors P2 and N2, and the node B is connected to gates of the transistors P1 and N1.

The SRAM cell 101 stores data. More specifically, the SRAM cell 101 stores a voltage level in a flipflop that is formed of two cross connected inverters. One of the crossed inverters is comprised of transistors P1 and N1, and the other is comprised of transistors P2 and N2. For example, when the node A has a voltage level about the same as the ground voltage VSS, that is, is logic low, the transistor P2 is turned on, and the transistor N2 is turned off, so that the node B is pulled up to nearly the level of the power supply voltage VDD and enters into a logic high state. When the node B is logic high, the transistor P1 is turned off, and the transistor N1 is turned on, so that the node A is pulled down to the ground voltage VSS and enters into a logic low state. In this way, the SRAM cell 101 is continuously latched.

The nodes A and B are connected to a bitline BL and a complementary bitline /BL, respectively, via NMOS transistors N3 and N4, respectively. The NMOS transistors N3 and N4 are referred to as access transistors or pass transistors. Gates of the NMOS transistors N3 and N4 are connected to a wordline WL that enables reading and writing operations. If the node A is logic low and the wordline WL is enabled to a logic high level, a current path from the bitline BL to the ground voltage VSS via the pass transistor N3 and the transistor N1 is formed, and the logic low state of the node A is read out to the bitline BL.

If the node A is logic low and the wordline WL is logic low, a leakage current path 103 from the bitline BL to the ground voltage VSS via the pass transistor N3 and the transistor N1 is formed in the SRAM cell 101.

As the size of SRAM cells continues to decrease, the amount of read current provided by the SRAM cell decreases. In particular, the read current decreases with a decrease in power supply voltage VDD due to technical advancement. In contrast with the decrease of the read current, the magnitude of the leakage current increases. With increased leakage current, the reading of data from an SRAM cell becomes more difficult, and an approach for of reducing the leakage current from each SRAM cell is required.

Techniques for reducing the leakage current from an SRAM cell are disclosed in U.S. Pat. Nos. 6,560,139 and 6,549,453.

Figure 2:
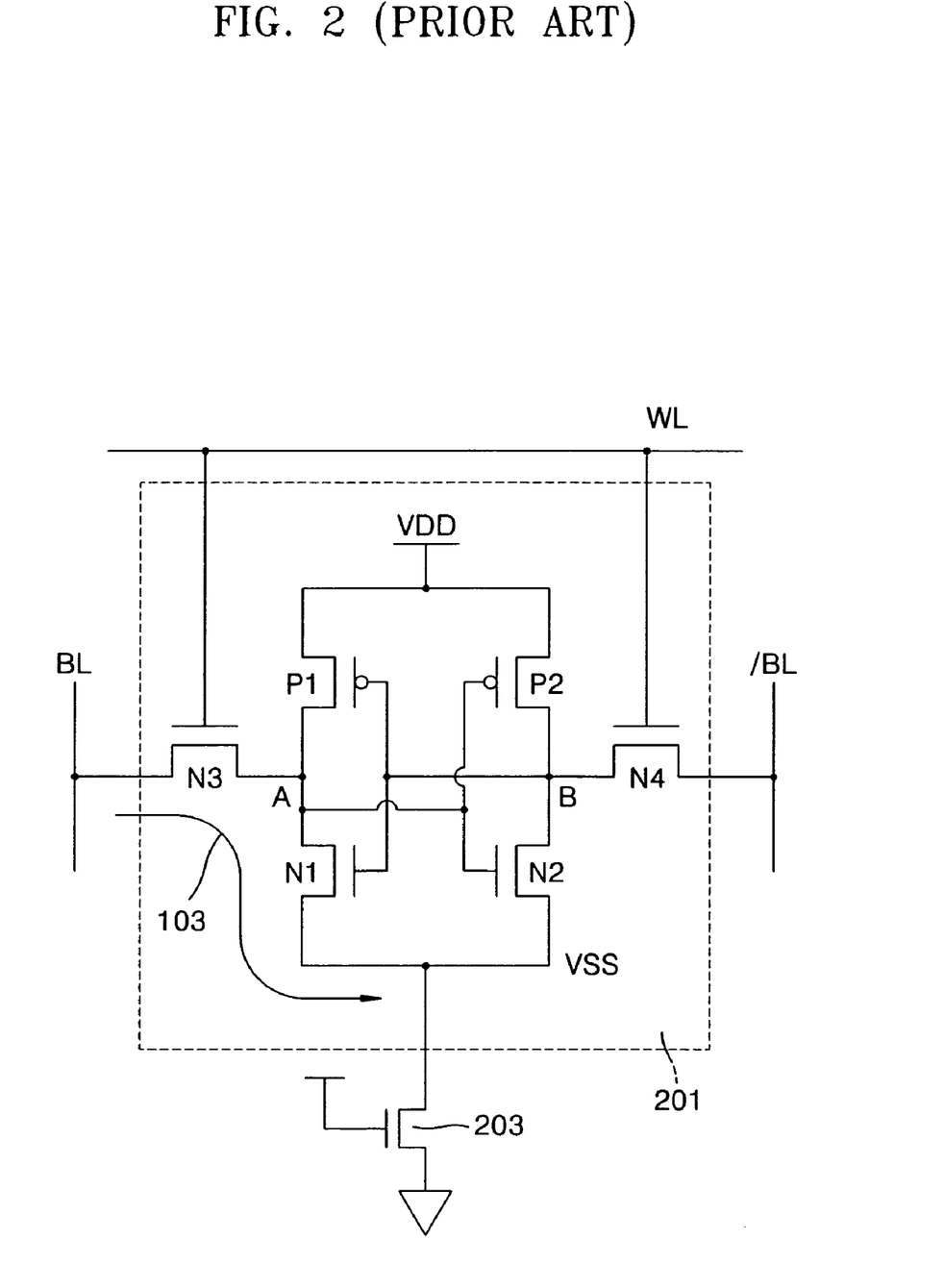
FIG. 2 illustrates a conventional low leakage current SRAM cell.

In an SRAM cell of U.S. Pat. No. 6,560,139 shown in FIG. 2, sources of pull-down transistors N1 and N2 are not directly connected to a ground voltage VSS but connected to the ground voltage VSS via a bias device 203. The bias device 203 is a transistor and operates to increase the voltages at the sources of the pull-down transistors N1 and N2 by a voltage drop across a channel of the bias transistor 203 that is gated to a power supply voltage VDD and turned on. When the voltages at the sources of the pull-down transistors N1 and N2 increase, a gate-source voltage of the transistors N1 and N2 is negative. Hence, reverse-biased source junctions deplete channels of the transistors N1 and N2, thereby increasing the threshold voltage Vt. Due to the increase of the threshold voltage Vt, read current is slightly reduced, but leakage current is reduced exponentially.

In SRAM cell array 200 of U.S. Pat. No. 6,549,453 shown in FIG. 3, a voltage of a VL node is increased from a ground voltage VSS by a threshold voltage Vt of an NMOS transistor using an NMOS transistor 208 diode-connected to a switching portion 206. Hence, as in the above U.S. Pat. No. '139, the leakage current is reduced, and the voltage swing width necessary for reversing a bit of a cell node from 0 to 1 or vice versa is also reduced. Also, the voltage of a VH node is decreased from the power supply voltage VDD by the threshold voltage Vt of a PMOS transistor using a PMOS transistor 214 diode-connected to a switching portion 210, and the voltage swing width necessary for reversing the bit of the cell node from 0 to 1 or vice versa is reduced.

Figure 3:
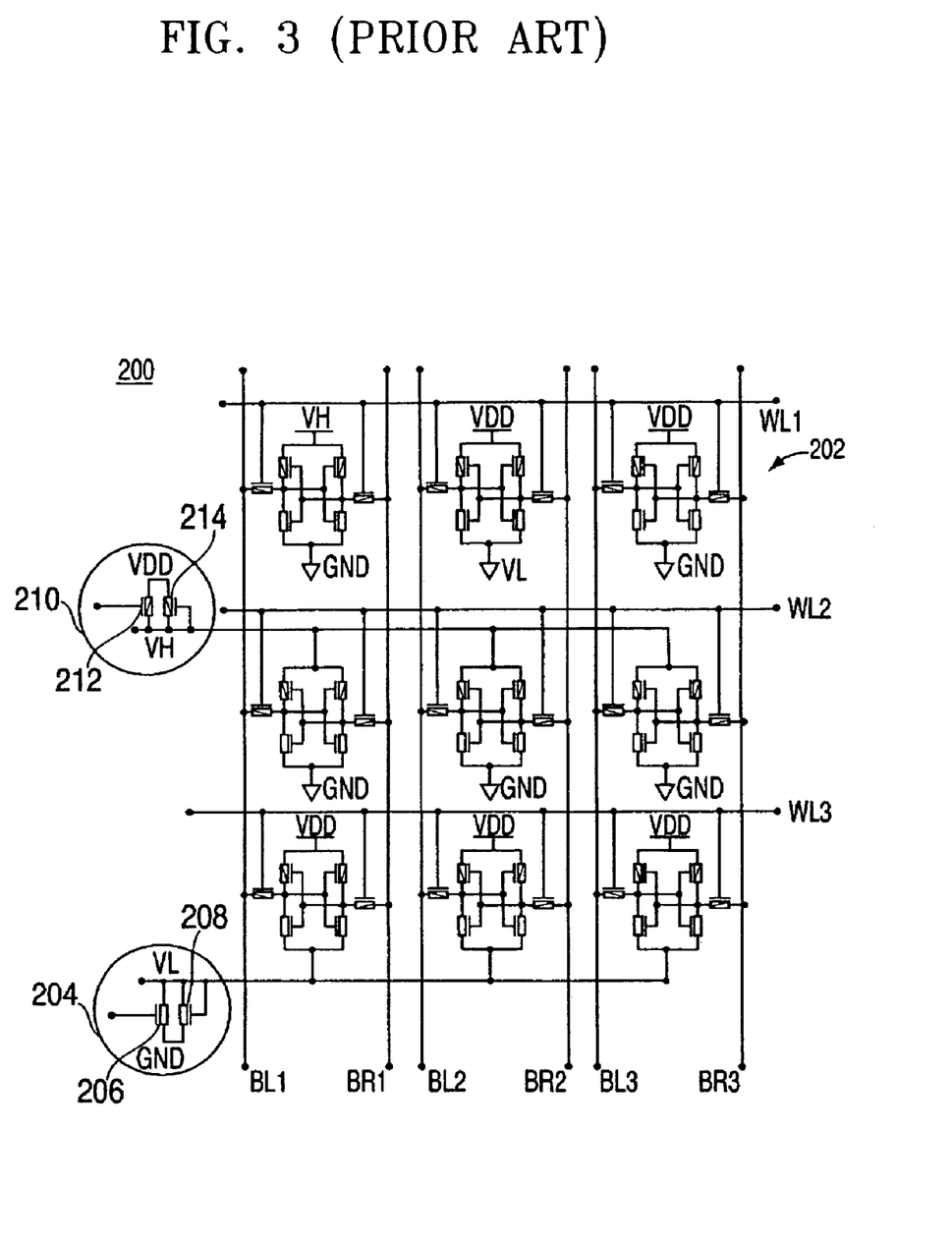
FIG. 3 illustrates a SRAM cell array having a conventional virtual rail scheme.

In a virtual rail technique where a power supply voltage is lowered to a predetermined voltage and a ground voltage VSS is increased to a predetermined voltage to achieve a low leakage current mode of an SRAM, the lowered power supply voltage VH and the increased ground voltage VL are determined depending on the amount of current leaking from each SRAM cell and a weak turn-on current of the transistors 208 and 214, which have diode characteristics.

When a low leakage current SRAM is applied to a system-on-chip (SOC) circuit configuration, the ranges of virtual rails VH and VL of the power supply voltage VDD and the ground voltage VSS are changed due to the influence of various voltage and temperature characteristics on the operation of the SOC. Further, during the manufacture of an SOC semiconductor device, the ranges of virtual rails VH and VL of the power supply voltage VDD and the ground voltage VSS are changed due to an influence of process parameters. The results of a simulation of the resulting virtual rail voltages depending on process, voltage, and temperature, that is, PVT, conditions, is illustrated in FIG. 4.

Figure 4:
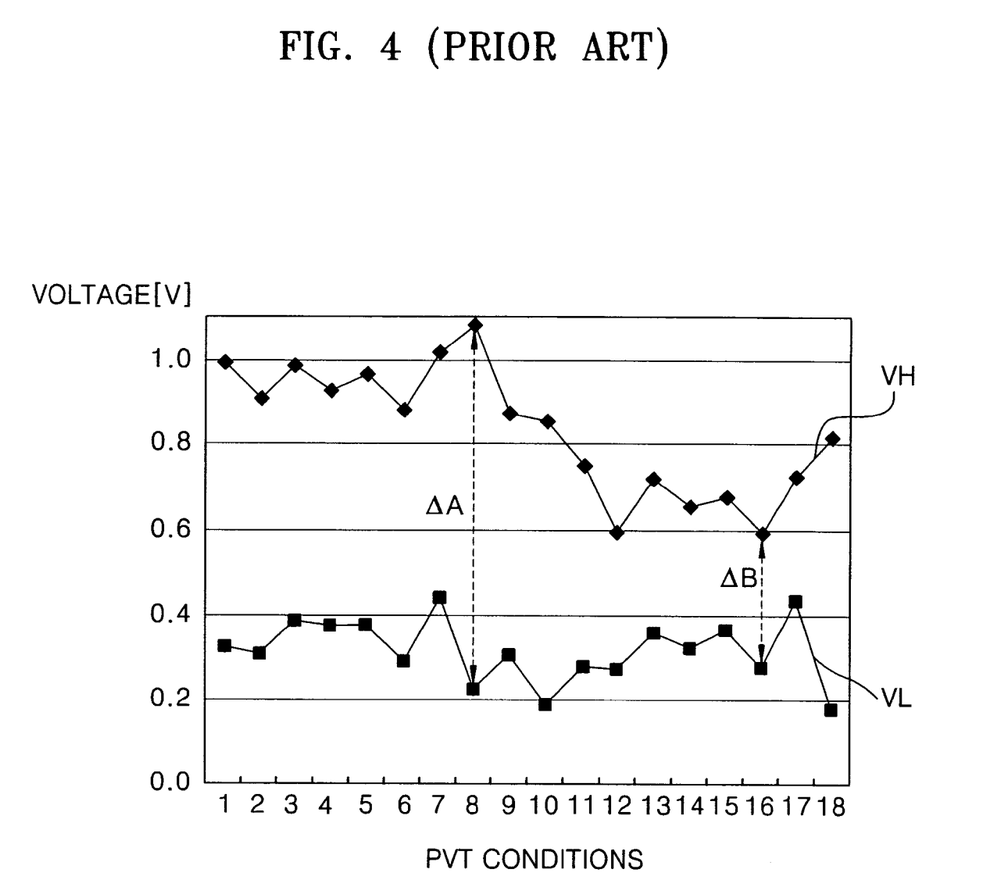
FIG. 4 is a graph illustrating simulation results of virtual rail voltages versus various PVT conditions of the SRAM cell array of FIG. 3.

FIG. 4 illustrates a virtual rail distribution versus PVT conditions in which a level of a power supply voltage VDD varies, for example 1.35V, 1.2V, 1.1V, 1.05V, etc., a temperature vary, for example, −55° C., 25° C., 125° C., etc., and operations of PMOS and NMOS transistors varies, for example, fast-fast (F-F), fast-slow (F-S), slow-fast (S-F), and slow-slow (S-S). Referring to FIG. 4, a virtual power supply voltage VH and a virtual ground voltage VL severely fluctuate according to the PVT conditions. In particular, the virtual power supply voltage VH and the virtual ground voltage VL have a maximum difference of ΔA and a minimum difference of ΔB. At portion ΔA, read current of an SRAM cell increases, so that the SRAM cell can operate stably but the leakage current increases. At portion ΔB, the leakage current is small but the read current of the SRAM cell decreases, so that the SRAM cell performs unstable reading operations.

SUMMARY OF THE INVENTION

The present invention provides a low leakage current SRAM that provides a virtual rail that is stable with various process-voltage-temperature (PVT) variations.

According to an aspect of the present invention, there is provided a synchronous random access memory (SRAM). A plurality of SRAM cells are connected to a word line, a bit line, a complementary bit line, a virtual power supply voltage, and a virtual ground voltage. A first bias device supplies a voltage level obtained by lowering a power supply voltage by a first voltage amount to the virtual power supply voltage when an SRAM cell is operating in a low leakage current mode and supplies the power supply voltage to the virtual power supply voltage when the SRAM cell is operating in an active mode. A second bias device supplies a voltage level obtained by raising a ground voltage by a second voltage amount to the virtual ground voltage when an SRAM cell is operating in the low leakage current mode and supplies the ground voltage to the virtual ground voltage when the SRAM cell is operating in the active mode.

More specifically, the first bias device includes: a first PMOS transistor including a source to which the power supply voltage is connected, a gate to which a first control signal, which, in one embodiment, is activated in the active mode, is connected, and a drain to which the virtual power supply voltage is connected; a second PMOS transistor including a source to which the power supply voltage is connected and a gate and a drain to which the virtual power supply voltage is connected; and a third NMOS transistor including a source and a gate to which the power supply voltage is connected and a drain to which the virtual power supply voltage is connected.

The second bias device includes: a first NMOS transistor having a source to which the ground voltage is connected, a gate to which a second control signal, which, in one embodiment, is activated in the active mode, is connected, and a drain to which the virtual ground voltage is connected; a second NMOS transistor having a source to which the virtual ground voltage is connected and a gate and a drain to which the ground voltage is connected; and a third PMOS transistor having a source and a gate to which the ground voltage is connected and a drain to which the virtual ground voltage is connected.

In one embodiment, each of the SRAM cells is a 6T SRAM-type cell. The virtual power supply voltage has a voltage level obtained by lowering the power supply voltage by a threshold voltage of the second PMOS transistor. The virtual ground voltage has a voltage level obtained by raising the ground voltage by a threshold voltage of the second NMOS transistor.

In another aspect, the present invention is directed to an SRAM comprising: a plurality of SRAM cells connected to a word line, a bit line, a complementary bit line, a virtual power supply voltage, and a virtual ground voltage; a first PMOS transistor including a source to which a power supply voltage is connected, a gate to which a first control signal, which is activated in an active mode, is connected, and a drain to which the virtual power supply voltage is connected; a second PMOS transistor including a source to which the power supply voltage is connected and a gate and a drain to which the virtual power supply voltage is connected; a third NMOS transistor including a source and a gate to which the power supply voltage is connected and a drain to which the virtual power supply voltage is connected; a first NMOS transistor having a source to which a ground voltage is connected, a gate to which a second control signal, which is activated in the active mode, is connected, and a drain to which the virtual ground voltage is connected; a second NMOS transistor having a source to which the virtual ground voltage is connected and a gate and a drain to which the ground voltage is connected; and a third PMOS transistor having a source and a gate to which the ground voltage is connected and a drain to which the virtual ground voltage is connected.

In one embodiment, each of the SRAM cells is a 6T SRAM-type cell. The virtual power supply voltage has a voltage level obtained by lowering the power supply voltage by a threshold voltage of the second PMOS transistor. The virtual ground voltage has a voltage level obtained by raising the ground voltage by a threshold voltage of the second NMOS transistor.

In this manner, by virtue of the SRAM of the present invention, the virtual power supply voltage obtained by lowering the power supply voltage by a threshold voltage of a transistor and the virtual ground voltage obtained by raising the ground voltage by a threshold voltage of a transistor are stably provided even in view of process-voltage-temperature (PVT) variations, thereby providing stable low-leakage current characteristics for the SRAM.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The attached drawings for illustrating preferred embodiments of the present invention are referred to in order to gain a sufficient understanding of the present invention, the merits thereof, and the objectives accomplished by the implementation of the present invention.

Hereinafter, the present invention will be described in detail by explaining preferred embodiments of the invention with reference to the attached drawings. Like reference numerals in the drawings denote like elements.

Figure 5:
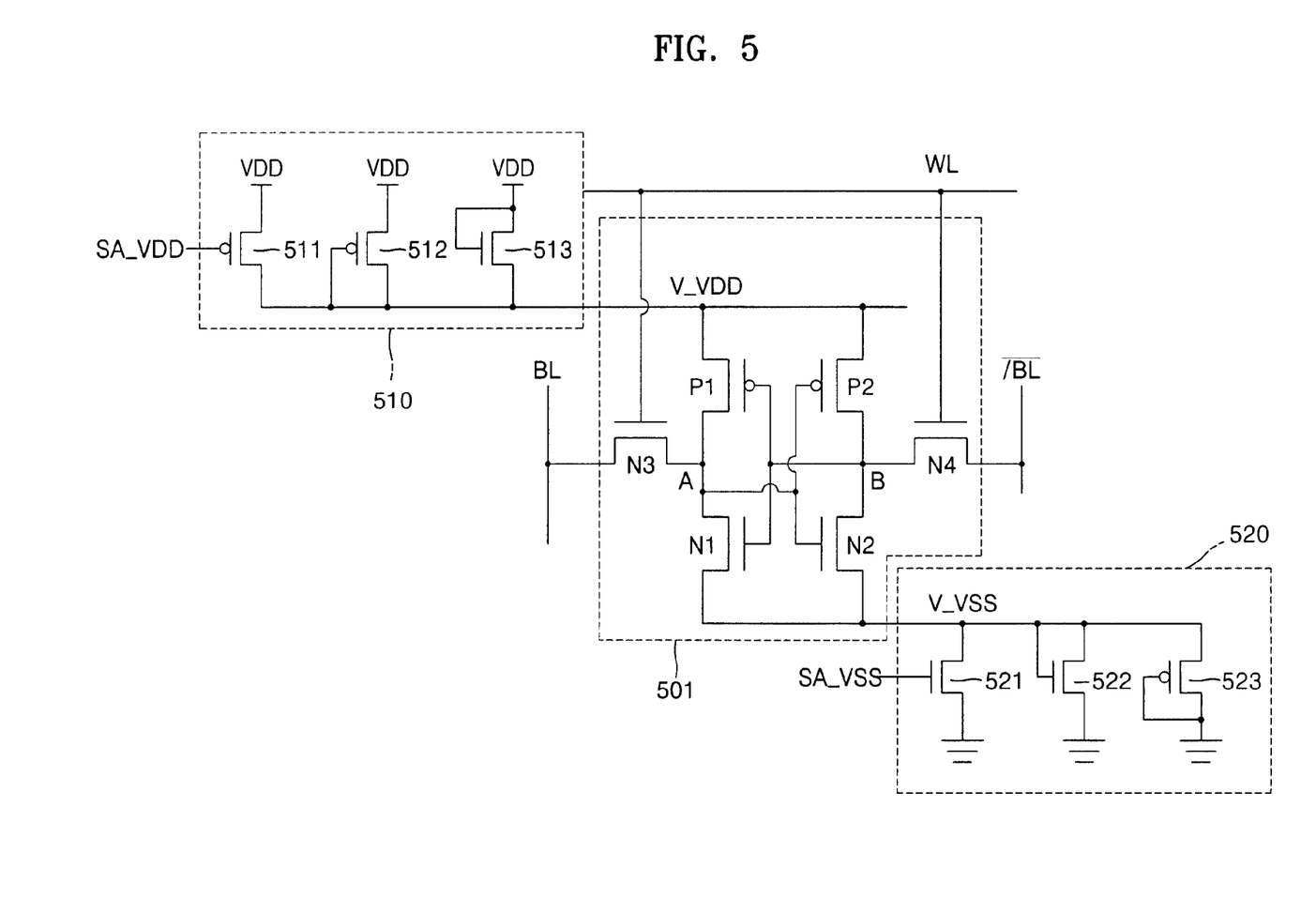
FIG. 5 illustrates a SRAM having a virtual rail configuration according to an embodiment of the present invention.

FIG. 5 illustrates a SRAM having a virtual rail scheme according to an embodiment of the present invention. Referring to FIG. 5, an SRAM cell 501 is configured substantially the same as the SRAM cell 101 of FIG. 1 except that sources of transistors P1 and P2 are not connected to a power supply voltage VDD but rather are connected to a virtual power supply voltage $V_{13}$ VDD transmitted via a first bias device 510 and that sources of transistors N1 and N2 are not connected to a ground voltage VSS but rather are connected to a virtual ground voltage V_VSS transmitted via a second bias device 520.

The first bias device 510 includes first and second PMOS transistors 511 and 512 and a third NMOS transistor 513. The first PMOS transistor 511 has a source to which the power supply voltage VDD is connected, a gate to which a first control signal SA_VDD is connected, and a drain to which the virtual power supply voltage V_VDD is connected. The second PMOS transistor 512 has a source to which the power supply voltage VDD is connected and a gate and a drain to which the virtual power supply voltage V_VDD is connected. The third NMOS transistor 513 has a source and a gate to which the power supply voltage VDD is connected and a drain to which the virtual power supply voltage V_VDD is connected.

The first PMOS transistor 511 is turned on in response to the first control signal SA_VDD, which is activated to logic low when an SRAM is in an active mode, and provides the power supply voltage VDD to the virtual power supply voltage V_VDD. When the SRAM is in a low leakage current mode, the first control signal SA_VDD is inactivated to logic high and turns off the first PMOS transistor 511. When the SRAM is in the low leakage current mode, a voltage level that the second PMOS transistor 512 of diode type drops from the power supply voltage VDD by a threshold voltage Vt of the second PMOS transistor 512 is provided to the virtual power supply voltage V_VDD. The second PMOS transistor 512 is used to reduce a leakage current. The operation of the third NMOS transistor 513 will be described below together with a third PMOS transistor 523.

The second bias device 520 includes first and second NMOS transistors 521 and 522 and the third PMOS transistor 523. The first NMOS transistor 521 has a source to which the ground voltage VSS is connected, a gate to which a second control signal SA_VSS is connected, and a drain to which the virtual ground voltage V_VSS is connected. The second NMOS transistor 522 has a source to which the ground voltage VSS is connected and a gate and a drain to which the virtual ground voltage V_VSS is connected. The third PMOS transistor 523 has a source and a gate to which the ground voltage VSS is connected and a drain to which the virtual ground voltage V_VSS is connected.

The first NMOS transistor 521 is turned on in response to the second control signal SA_VSS, which is activated to logic high when the SRAM is in the active mode, and provides the ground voltage VSS to the virtual ground voltage V_VSS. When the SRAM is in a low leakage current mode, the second control signal SA_VSS is inactivated to logic low and turns off the first NMOS transistor 521. When the SRAM is in the low leakage current mode, the second NMOS transistor 522 of diode type raises the virtual ground voltage V_VSS from the ground voltage VSS by a threshold voltage Vt of the second NMOS transistor 522. The second NMOS transistor 522 operates to reduce leakage current.

Figure 6:
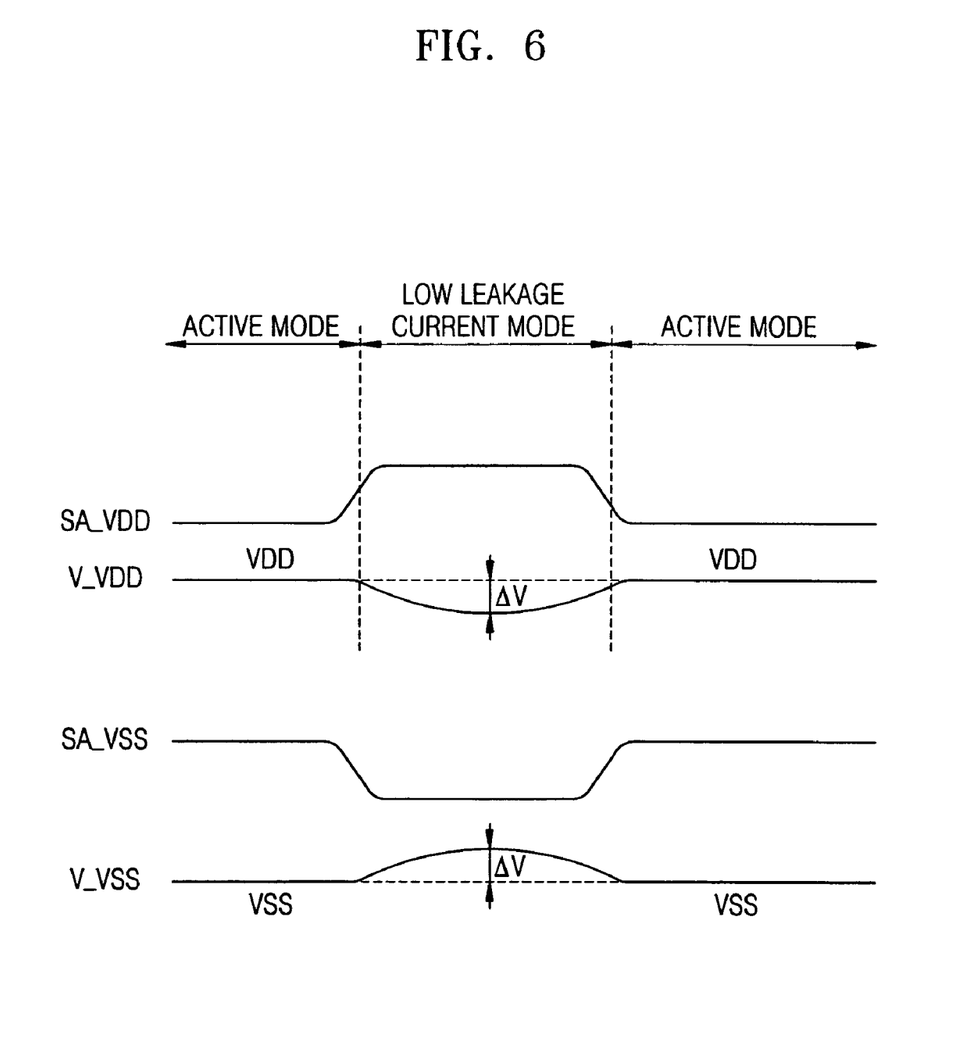
FIG. 6 is an operational diagram of the SRAM of FIG. 5, in accordance with the present invention.

An operational diagram of the SRAM of FIG. 5 is illustrated in FIG. 6. When the SRAM is operating in the active mode, the virtual power supply voltage V_VDD becomes the power supply voltage VDD, and the virtual ground voltage V_VSS becomes the ground voltage VSS. When the SRAM is in the low leakage current mode, the virtual power supply voltage V_VDD becomes a voltage VDD-ΔV, and the virtual ground voltage V_VSS becomes a voltage ΔV. ΔV denotes the threshold voltage Vt of the transistors 512 and 522.

Figure 7:
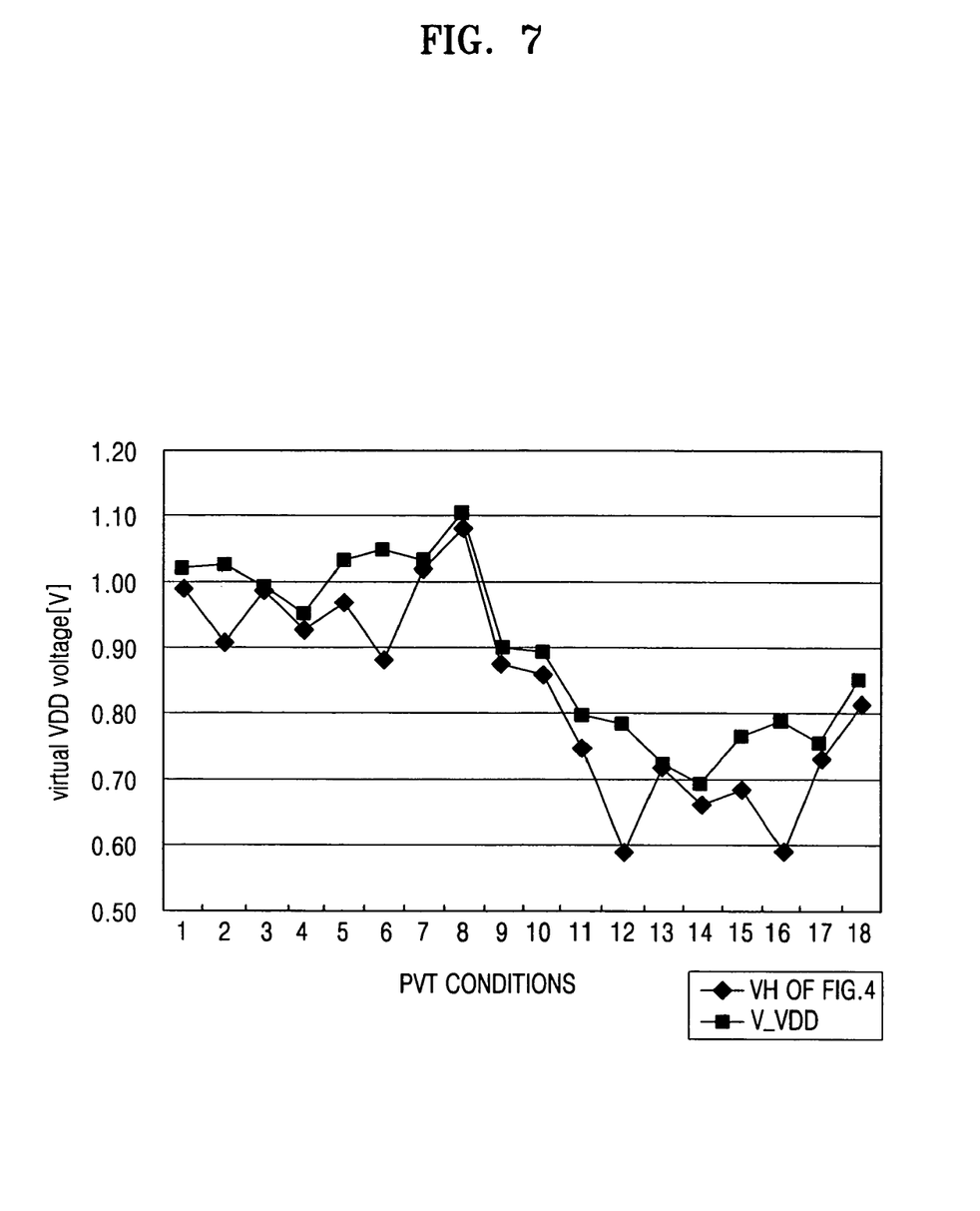
FIG. 7 is a graph illustrating simulation results of a virtual power supply voltage versus various PVT conditions of the SRAM of FIG. 5, in accordance with the present invention.
Figure 8:
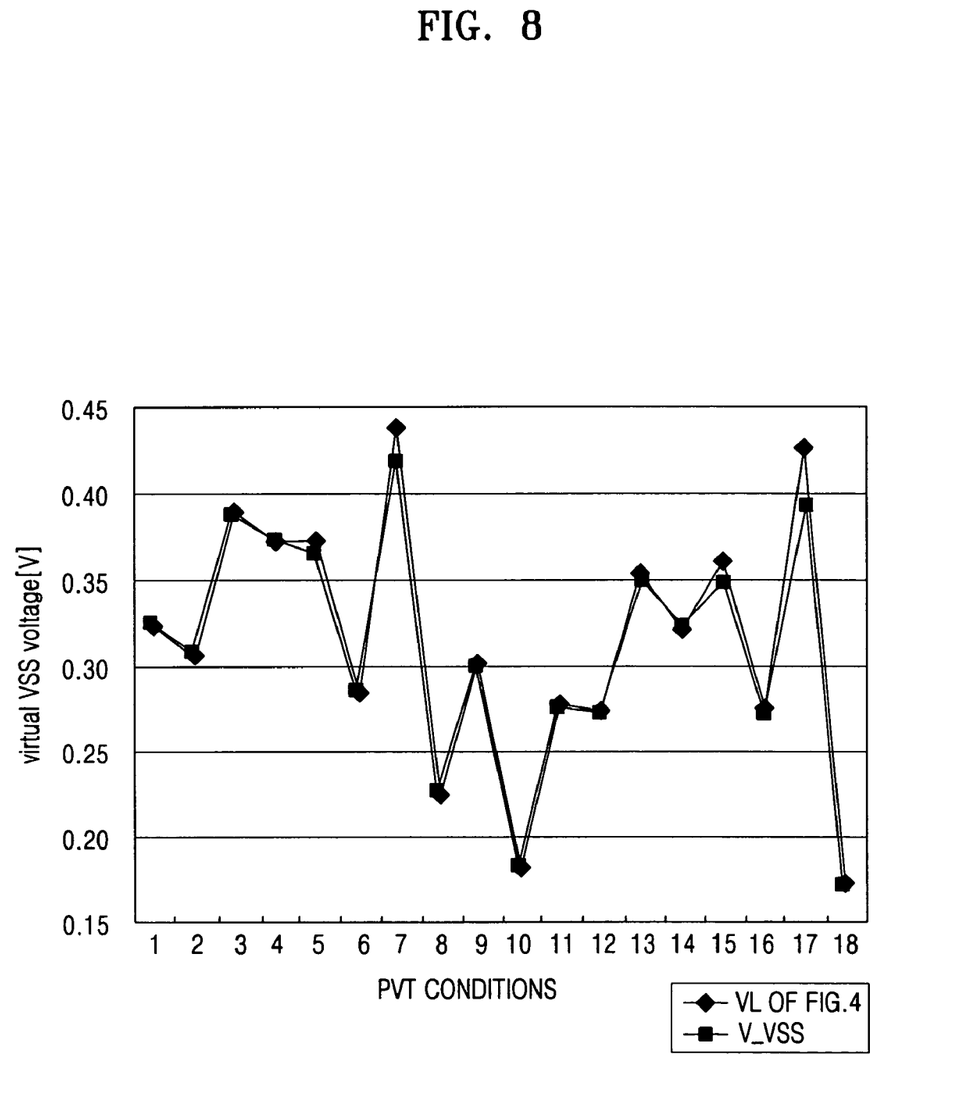
FIG. 8 is a graph illustrating simulation results of a virtual ground voltage versus various PVT conditions of the SRAM of FIG. 5, in accordance with the present invention.

The operation of the third NMOS and PMOS transistors 513 and 523 is now described with reference to the graphs of FIGS. 7 and 8, which illustrate the virtual power supply voltage V_VDD and the virtual ground voltage V_VSS, respectively, in response to various PVT conditions. Similar to the graph of FIG. 4, the graphs of FIGS. 7 and 8 illustrate a virtual rail distribution versus PVT conditions in which a level of the power supply voltage VDD varies: 1.35V, 1.2V, 1.1V, 1.05V, etc.; temperature varies: −55° C., 25° C., 125° C., etc., and operations of the PMOS and NMOS transistors vary: fast-fast (F-F), fast-slow (F-S), slow-fast (S-F), and slow-slow (S-S). FIGS. 7 and 8 compare the virtual power supply voltage V_VDD and the virtual ground voltage V_VSS of the SRAM of FIG. 5 with the virtual power supply voltage VH and the virtual ground voltage VL in response to the varying PVT conditions. Referring to FIG. 7, the virtual power supply voltage V_VDD according to an embodiment of the present invention fluctuates less severely than the virtual power supply voltage VH of FIG. 4. Referring to FIG. 8, the virtual ground voltage V_VSS according to an embodiment of the present invention fluctuates less severely than the virtual ground voltage VL of FIG. 4. Thus, leakage current variation in response to variation in PVT conditions of the virtual power supply voltage V_VDD and the virtual ground voltage V_VSS is reduced.

The SRAM in accordance with the present invention provides a virtual power supply voltage to an SRAM cell that is obtained by lowering a power supply voltage by a threshold voltage of a transistor and a virtual ground voltage obtained by raising a ground voltage by a threshold voltage of a transistor. Due to the use of PMOS and NMOS transistors configured as diode types connected between the power supply voltage and the virtual power supply voltage and the use of NMOS and PMOS transistors configured as diode types connected between the ground voltage and the virtual ground voltage, a virtual power supply voltage level and a virtual ground voltage level that are stable even against various PVT variations are provided, so that low-leakage current characteristics are stable for the SRAM.

While the present invention has been particularly shown and described with reference to exemplary embodiments thereof, it will be understood by those of ordinary skill in the art that various changes in form and details may be made herein without departing from the spirit and scope of the present invention as defined by the following claims.

What is claimed is:

1. A synchronous random access memory (SRAM) comprising:

a plurality of SRAM cells connected to a word line, a bit line, a complementary bit line, a virtual power supply voltage, and a virtual ground voltage;

a first bias device supplying a voltage level obtained by lowering a power supply voltage by a first voltage amount to the virtual power supply voltage when an SRAM cell is operating in a low leakage current mode and supplying the power supply voltage to the virtual power supply voltage when the SRAM cell is operating in an active mode; and a second bias device supplying a voltage level obtained by raising a ground voltage by a second voltage amount to the virtual ground voltage when an SRAM cell is operating in the low leakage current mode and supplying the ground voltage to the virtual ground voltage when the SRAM cell is operating in the active mode.

2. The SRAM of claim 1, wherein the first bias device comprises:

a first PMOS transistor including a source to which the power supply voltage is connected, a gate to which a first control signal is connected, and a drain to which the virtual power supply voltage is connected;

a second PMOS transistor including a source to which the power supply voltage is connected and a gate and a drain to which the virtual power supply voltage is connected; and a third NMOS transistor including a source and a gate to which the power supply voltage is connected and a drain to which the virtual power supply voltage is connected.

3. The SRAM of claim 2 wherein the first control signal is activated when an SRAM cell is operating in the active mode.

4. The SRAM of claim 1, wherein the second bias device comprises:

a first NMOS transistor having a source to which the ground voltage is connected, a gate to which a second control signal is connected, and a drain to which the virtual ground voltage is connected;

a second NMOS transistor having a source to which the virtual ground voltage is connected and a gate and a drain to which the ground voltage is connected; and a third PMOS transistor having a source and a gate to which the ground voltage is connected and a drain to which the virtual ground voltage is connected.

5. The SRAM of claim 4 wherein the second control signal is activated when an SRAM cell is operating in the active mode.

6. The SRAM of claim 1, wherein each of the SRAM cells is a 6T SRAM-type cell.

7. The SRAM of claim 1, wherein the virtual power supply voltage has a voltage level obtained by lowering the power supply voltage by a threshold voltage of the second PMOS transistor.

8. The SRAM of claim 1, wherein the virtual ground voltage has a voltage level obtained by raising the ground voltage by a threshold voltage of the second NMOS transistor.

9. An SRAM comprising:

a plurality of SRAM cells connected to a wordline, a bitline, a complementary bitline, a virtual power supply voltage, and a virtual ground voltage;

a first PMOS transistor including a source to which a power supply voltage is connected, a gate to which a first control signal, which is activated in an active mode, is connected, and a drain to which the virtual power supply voltage is connected;

a second PMOS transistor including a source to which the power supply voltage is connected and a gate and a drain to which the virtual power supply voltage is connected;

a third NMOS transistor including a source and a gate to which the power supply voltage is connected and a drain to which the virtual power supply voltage is connected;

a first NMOS transistor having a source to which a ground voltage is connected, a gate to which a second control signal, which is activated in the active mode, is connected, and a drain to which the virtual ground voltage is connected;

a second NMOS transistor having a source to which the virtual ground voltage is connected and a gate and a drain to which the ground voltage is connected; and a third PMOS transistor having a source and a gate to which the ground voltage is connected and a drain to which the virtual ground voltage is connected.

10. The SRAM of claim 9 wherein the first control signal is activated when an SRAM cell is operating in the active mode.

11. The SRAM of claim 9 wherein the second control signal is activated when an SRAM cell is operating in the active mode.

12. The SRAM of claim 9, wherein each of the SRAM cells is a 6T SRAM-type cell.

13. The SRAM of claim 9, wherein the virtual power supply voltage has a voltage level obtained by lowering the power supply voltage by a threshold voltage of the second PMOS transistor.

14. The SRAM of claim 7, wherein the virtual ground voltage has a voltage level obtained by raising the ground voltage by a threshold voltage of the second NMOS transistor.

* * * * *